US005620614A

United States Patent [19]

Drake et al.

[11] Patent Number: 5,620,614

[45] Date of Patent: Apr. 15, 1997

[54] PRINTHEAD ARRAY AND METHOD OF PRODUCING A PRINTHEAD DIE ASSEMBLY THAT MINIMIZES END CHANNEL DAMAGE

[75] Inventors: Donald J. Drake; Almon P. Fisher, both of Rochester, N.Y.

[73] Assignee: Xerox Corporation, Stamford, Conn.

[21] Appl. No.: 367,619

[22] Filed: Jan. 3, 1995

[51] Int. Cl.[6] .......................... H01L 21/00; G01D 15/18; B44C 1/22

[52] U.S. Cl. ................................ 216/27; 347/42; 438/21; 438/456; 438/458; 216/2

[58] Field of Search .................................. 216/2, 27, 52; 437/226

[56] References Cited

U.S. PATENT DOCUMENTS 4,601,777 7/1986 Hawkins et al. ........................ 156/626
4,774,530 9/1988 Hawkins ............................ 346/140 R
4,786,357 11/1988 Campanelli et al. .................. 156/633
4,814,296 3/1989 Jedlicka et al. ........................ 437/226
4,829,324 5/1989 Drake et al. ........................ 346/140 R
4,851,371 7/1989 Fisher et al. ............................ 437/226
4,878,992 11/1989 Campanelli ............................ 156/633
4,961,821 10/1990 Drake et al. ............................ 156/467
5,000,811 3/1991 Campanelli ............................ 156/264
5,041,190 8/1991 Drake et al. ............................ 156/647
5,128,282 7/1992 Ormond et al. ........................ 437/226
5,160,403 11/1992 Fisher et al. ............................ 156/633
5,219,796 6/1993 Quinn et al. ............................ 437/227

*Primary Examiner*—R. Bruce Breneman
*Assistant Examiner*—Michael E Adjodha
*Attorney, Agent, or Firm*—Oliff & Berridge

[57] ABSTRACT

A method of fabricating a pagewidth array of buttable printheads reduces end channel damage. The wafer containing a plurality of arrays of channels is provided with V-grooves. A V-groove is positioned between each array. When the wafer is secured to a wafer containing heater plates, wafers are diced along the V-shaped grooves to reduce damage to the end channels of the array to improve print quality.

24 Claims, 3 Drawing Sheets

PRINTHEAD ARRAY AND METHOD OF PRODUCING A PRINTHEAD DIE ASSEMBLY THAT MINIMIZES END CHANNEL DAMAGE

BACKGROUND OF THE INVENTION

1. Field of the Invention

This invention relates to thermal ink jet printing, and more particularly to a printhead array and methods of fabricating butted printhead arrays for improving print quality in pagewidth array printheads having a plurality of butted printhead die assemblies.

2. Description of Related Art

Thermal ink jet printheads typically include a heater plate that includes a plurality of resistive heating elements and passivated addressing electrodes formed on an upper surface thereof and a channel plate having a plurality of channels, which correspond in number and position to the heating elements, formed on a lower surface thereof. The upper surface of the heater plate is bonded to the lower surface of the channel plate so that a heater element is located in each channel. The channel plate usually includes at least one fill hole extending from its upper surface to its lower surface that is in direct fluid communication with the channels so that ink is supplied from a source into the channels.

Drop-on-demand thermal ink jet printheads typically are fabricated by using silicon wafers and processing technology to make multiple small heater plates and channel plates. This works extremely well for small printheads. However, for large array or pagewidth printheads, a monolithic array of ink channels cannot be practically fabricated in a single wafer since the maximum commercial wafer size is six inches. Even if ten inch wafers were commercially available, it is not clear that a monolithic channel array would be very feasible. This is because a single defective channel out of 2,550 channels would render the entire channel plate useless. This yield problem is aggravated by the fact that the larger the silicon ingot diameter, the more difficult it is to make it defect-free. Furthermore, most of the wafer would be thrown away, resulting in very high fabrication costs.

Since silicon wafers are not currently available having a length corresponding to a pagewidth, the current practice is to form the nozzles, passageways and integrated circuitry on silicon wafers, separate these wafers into wafer subunits (or chips) which contain butt surfaces or edges, align these subunits along their butt surfaces or edges into an array having a length of a pagewidth, for example, and attach the array to a substrate to form a pagewidth printhead. The layering of the wafers (i.e., the channel wafer and the circuitry wafer), if necessary, to form the complete printhead can be performed before or after separation into subunits. Since many wafer subunits are aligned to form an array, each subunit must be uniform. In order for the subunits to be uniform, the location of the butt edges or surfaces relative to the circuitry and channels must be precise.

Discrete printheads may be fabricated by forming a plurality of sets of heating elements and a plurality of sets of channels in separate silicon wafers that are later bonded to each other and separated, such as by dicing, to form discrete printhead modules (or die assemblies). The sets of heater elements and sets of channels are located on their respective silicon wafers in a plurality of rows and columns to form corresponding matrices thereon. The bonded wafers are separated between each row and column to form the discrete printhead modules. Each discrete printhead module includes a portion of the wafer containing the heater elements (known as a heater plate) and a portion of the other wafer containing a set of channels (known as a channel plate). After forming the discrete printhead modules, a plurality of the printhead modules can be aligned and butted against one another on a support substrate, such as, for example, a heat sink, to form a pagewidth printhead formed from a linear array of printhead modules.

In an attempt to improve alignment in a pagewidth array, Drake et al. U.S. Pat. No. 4,829,324 discloses a large array thermal ink jet printhead. The printhead is formed of an array of abutting individual subunits. Each subunit includes etched sloping sides that permit accurate alignment of adjacent subunits. In a separate embodiment, the sloping sides are produced by dicing along a large etched groove formed on one end of the channel plate.

U.S. Pat. No. 4,829,324 does not recognize that grooves formed adjacent to the end channels of each channel array (i.e., each channel plate) in the surface containing the channels can protect the end channels from damage caused by cracking that occurs during dicing. Referring to FIG. 12 of U.S. Pat. No. 4,829,324, it can be seen that the dice cut on the left side of each subunit is spaced a relatively large distance from the left-most channel and therefore would not affect the left-most channel even if cracking were to occur. A large groove formed from the surface of the channel wafer opposite from the channel surface defines the right side of each subunit. Accordingly no dicing is performed on the right side of the channel plate. Additionally, etched surfaces define the butt ends of each subunit, rather than diced surfaces. The formation of the large etched grooves is time consuming, thereby increasing production time and costs.

Drake et al. U.S. Pat. No. 4,961,821 discloses a method of fabricating a pagewidth printhead for an ink jet printing device having a plurality of abutted individual subunits. The individual subunits are formed without dicing. Subunits are separated from each other by anisotropically etching first and second intersecting recesses.

Ormond et al. U.S. Pat. No. 5,128,282 discloses a process for separating image sensor dies from a wafer that minimizes silicon waste. Each row of dies on a wafer is separated by a pair of separation V-grooves. The grooves are provided to reduce microscopic damage occurring in the die surface during a dicing operation. The provision of the grooves reduces damage to the active surface of the dies and any circuits contained thereon. A related process also is disclosed in Jedlicka et al. U.S. Pat. No. 4,814,296.

Fisher et al. U.S. Pat. No. 5,160,403 discloses a method of fabricating a printhead die having a buttable surface. A pagewidth printhead is formed from a staggered array of discrete ink jet print modules. Each module is manufactured by providing a shallow precision dice cut that defines a lateral aligning surface having a minimal height in the surface of a channel plate defining substrate adjacent to each of the channels.

Another related patent is Campanelli et al. U.S. Pat. No. 4,786,357. Grooves are provided for dicing between individual die assemblies. Dicing is spaced a sufficient distance from the end channels of the die assemblies such that end channel damage is not a concern. Additionally, the dice cuts do not form buttable surfaces.

In all ink jet printing systems, the nozzle or channel size, shape and surface conditions affect the characteristics and trajectory of the ink droplet emitted from the channel. All of these factors affect print quality. The prior art discussed above does not address the impact of dicing the channel plate during formation of individual printheads on print quality. As the channel plate is diced into individual printheads, end channels can be subject to chipping as a result of the dicing process when the dicing is performed very close to the end channels, as is desired in some printhead arrangements. The chipping can affect the size, shape and surface conditions of the end channels. This adversely affects the overall print quality.

SUMMARY OF THE INVENTION

It is an object of embodiments of the present invention to reduce end channel damage of printheads produced during dicing.

It is another object of embodiments of the present invention to provide a method of fabricating individual printhead die assemblies that can be butted together to form a printhead array having a length of a pagewidth, for example.

According to embodiments of the present invention, a method of fabricating individual buttable die assemblies for use in a pagewidth array ink jet printing apparatus includes placing a groove adjacent to the channel at each end of each channel array formed on a channel wafer. Ends of each channel plate are defined by dicing through these grooves. The grooves prevent cracks from adversely affecting the end channels.

The printheads are formed from two bonded substrates containing channel plates and heater plates, respectively. For example, each substrate can be a silicon wafer. A plurality of heater element arrays defining a plurality of heater plates are formed on a first surface of a first wafer. A plurality of arrays of channels defining a plurality of channel plates are formed on a first surface of a second wafer. Each channel array has a pair of end channels (one channel at each end of each array). The first surfaces of the first and second wafers are aligned and bonded to each other such that each array of channels on the second wafer corresponds to an array of heating elements on the first wafer. The bonded wafers are then diced to form individual printhead die assemblies.

The second wafer containing the channel plates is provided with V-grooves in its first surface. A V-groove is positioned adjacent to each end channel so that a pair of grooves are located between each array of channels. The bonded wafers are diced along the V-grooves to form multiple die assemblies. This reduces chipping of the wafers that can cause damage to the end channels if the grooves were not present. This arrangement allows dicing to be performed very close to the end channels so that adjacent die assemblies can be butted while maintaining a uniform spacing between the end channels of adjacent die assemblies.

BRIEF DESCRIPTION OF THE DRAWINGS

The invention will be described in conjunction with the following drawings in which like reference numerals designate like elements and wherein.

DETAILED DESCRIPTION OF PREFERRED EMBODIMENTS

Embodiments of the present invention involve fabricating individual buttable printhead die assemblies by forming grooves between arrays of channel openings on a wafer from which a plurality of channel plates are formed. By this method, the wafer can be separated into individual channel plates (or die assemblies including channel plates) without damaging end channel openings on individual channel plates.

Figure 1:
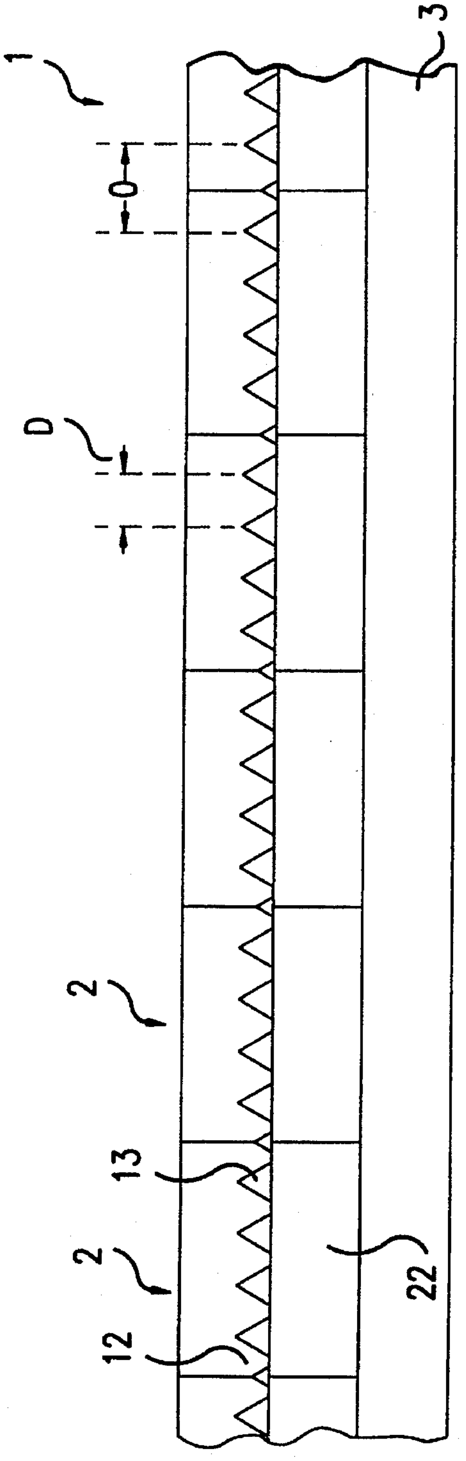
FIG. 1 is a front view of a pagewidth printhead formed from an array of butted individual printhead die assemblies.
Figure 2:
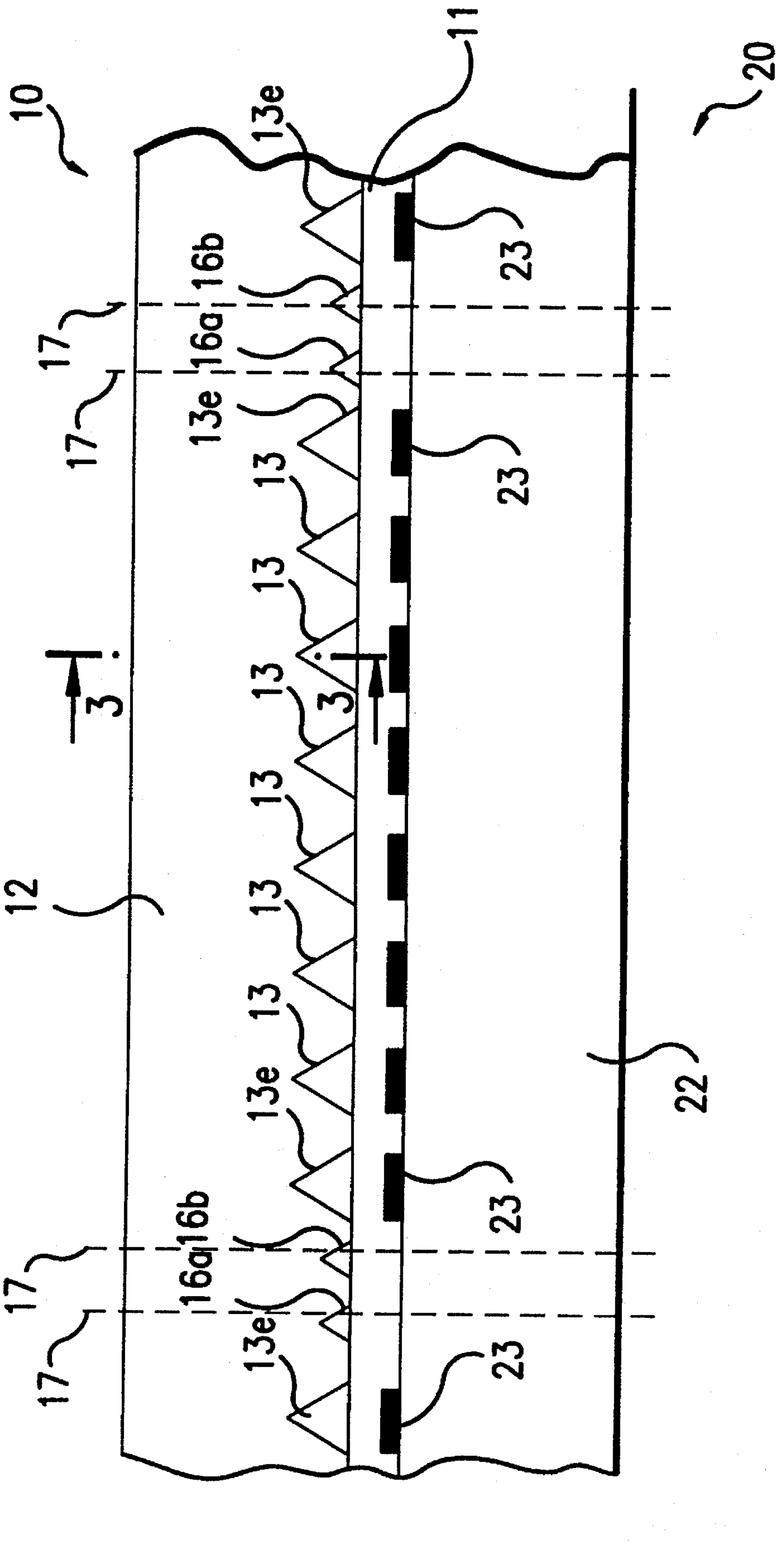
FIG. 2 is an enlarged front view of a first wafer having a plurality of heater plates bonded to a second wafer having a plurality of channel plates, with a pair of V-grooves located between the end channels of adjacent channel plates.

FIG. 1 is a partial front view of a pagewidth printhead array 1 for use in an ink jet printing apparatus (not shown). The term ink jet printing apparatus as defined in the specification and claims encompasses all ink jet marking devices including but not limited to, for example, plotters, copiers, printers, labelers and facsimile machines. The pagewidth printhead array 1 comprises a plurality of individual butted printhead die assemblies 2 mounted to a substrate 3 (such as a daughter board or heat sink, for example). Each printhead die assembly 2 includes a heater plate 22 having a plurality of heating elements 23 formed on a first, upper surface thereof, as shown in FIG. 2. Each printhead die assembly also includes a channel plate 12 having an array of channels 13 formed on a first, lower surface thereof.

Figure 3:
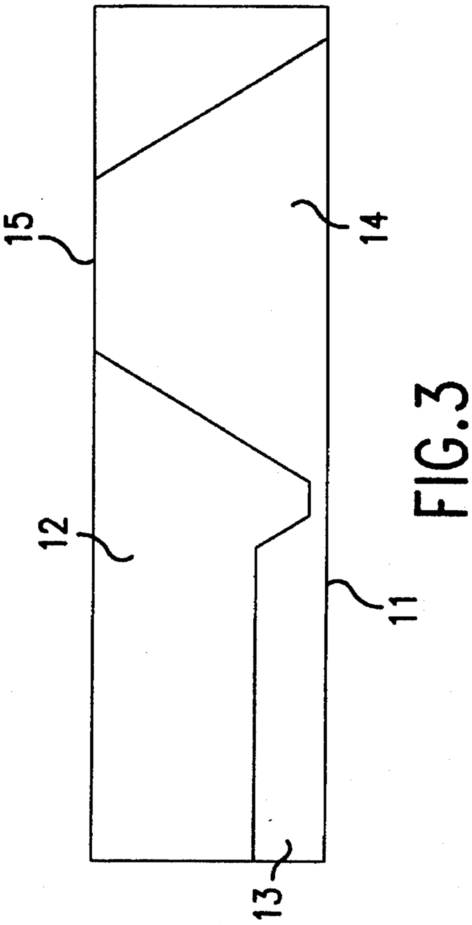
FIG. 3 is a cross-sectional side view of a channel plate along line 3—3 of FIG. 2.

Formation of each channel plate 12 will be discussed in connection with FIG. 2. As illustrated in FIG. 2, a wafer 10, preferably of silicon, includes a first, lower surface 11. A plurality of individual channel plates 12 are formed on each wafer. Each channel plate 12 includes an array of channels 13 having end channels **13*e*. The channels 13 terminate at an internal recess 14, shown in FIG. 3. The internal recess 14 is used as an ink supply manifold for supplying ink, for example, by capillary action to the ink channels 13. As shown in FIG. 3, each channel plate includes an opening 15 in a second, upper surface opposite from the lower surface 11 in fluid communication with the internal recess 14. Through the opening 15, ink is supplied to the internal recess 14**. The basic structure of the channel plate is shown, for example, in Hawkins U.S. Pat. No. 4,774,530, the disclosure of which is incorporated herein by reference.

The channels 13, the recess 14 and opening 15 are produced by etching the wafer 10. Anisotropic etching of (100) silicon wafers preferably is conducted through square or rectangular vias so that the etching is along the <111> planes. Thus, each recess or opening has walls at 54.7 degrees with the surface of the wafer. If the square or rectangular opening is small with respect to the wafer thickness a recess is formed. For example, a small etched rectangular surface shape will produce an elongated, V-grooved recess with all walls at 54.7 degrees with the wafer surface. As is well known in the art, only internal corners may be anisotropically etched. External or convex corners do not have <111> planes to guide the etching and the etchant etches away such corners very rapidly. This is why the channels cannot be opened at their ends, but instead must be completed by a separate process, such as milling or isotropic etching.

Formation of the heater plate 22 will also be discussed in connection with FIG. 2. As illustrated in FIG. 2, a wafer 20, preferably of silicon, is supplied having an upper surface 21.

A plurality of individual heater plates 22 are formed on the upper surface of each wafer 20 using well known techniques. Each heater plate 22 includes an array of heating elements 23 and addressing electrodes (not shown) patterned on the upper surface 21. The above-incorporated U.S. Pat. No. 4,774,530 also disclosed the basic structure of the heater plates. Unlike U.S. Pat. No. 4,774,530, which fabricates printheads from a single die assembly (rather than full width printheads from arrays of die assemblies) and locates the electrode terminals to the side of the heater plates, in embodiments of the present invention, the electrode terminals are disposed at the rear of the heater plates. This enables sides of adjacent die assemblies to be butted against each other. See, for example, Fisher et al. U.S. Pat. Nos. 4,829,324 and 4,851,371, the disclosures of which are incorporated herein by reference in their entireties.

The wafers 10 and 20 are then bonded together using conventional techniques such that the array of channels 13 on one channel plate 12 is aligned with the array of heater elements 23 on a corresponding heater plate 22. The bonded wafers are then diced to form individual printhead die assemblies 2. The individual printhead die assemblies are mounted to a substrate 3 to form a full, width (e.g. pagewidth) ink jet printing apparatus.

While the standard technique of dicing silicon wafers used by the semiconductor industry for many years can produce dies having reasonably controlled dimensions, the microscopic damage occurring to the die surface during the dicing operation has effectively prevented locating the end channels of each channel plate within the required proximity to the channel plate end to form a pagewidth array without damaging the end channels. This is because the surface of silicon wafers is virtually always parallel to the <100> plane of the crystalline lattice so that, when a wafer of this type is cut or diced with a high speed diamond blade, chips and slivers are broken away from the top surface of the wafer in the direct vicinity of the cut created by the blade. This surface chipping may extend to about 50 μm, thus rendering it impossible for active elements of printhead to be located any closer than about 50 μm from the dicing cut. As a result, long linear arrays made up of individual dies assembled together end to end have only been possible for low resolution devices, i.e., those having a spatial frequency of 5 lines per mm or less.

In a preferred embodiment of the present invention, the channel wafer 10 is formed with a pair of V-grooves **16*a* and 16*b* as shown in FIG. 2 positioned between the arrays of channels 13 such that the pair of V-grooves 16*a* and 16*b* is positioned between adjacent end channels 13*e* of adjacent channel plates 12. The V-grooves 16*a* and 16*b*** are preferably formed when the channels are formed in a similar manner (e.g., by etching).

The V-grooves preferably have a size equal to or smaller than the size of the channels 13 so that they can be formed in the same or less amount of time as the channels 13. The channels 13 have size between 10 μm and 100 μm. The V-grooves preferably have a size between 2 μm and 40 μpm. The spacing of a V-groove relative to its adjacent end channel **13*e* should be such that when dicing occurs through the V-groove, the distance between the end surface of the channel plate formed by the dice cut and the end channel 13*e* is small enough to enable adjacent dies to be butted against each other to form a pagewidth array in which the spacing of end channels 13*e* between adjacent printhead die assemblies 2 is uniform. That is, the distance between adjacent end channels 13*e* of adjacent butted die assemblies should be the same as the distance D between adjacent channels within a die assembly (See FIG. 1). The distance between the peak of an end channel 13*e* and the peak of a groove is approximately equal to half the distance D between the peaks of adjacent channels. The distance D may be between 10 μm and 150 μm. For example, in a 1200 spots/inch pagewidth array the spacing D is approximately equal to 21 μm. As a result, the distance between the peak of the V-groove and the peak of the end channel is approximately 10.5 μm. In a 600 spots/inch pagewidth array, the spacing D is approximately equal to 42 μm. The spacing between the peak of the V-groove and the peak of the end channel is then approximately equal to 21 μm. With such an arrangement it is possible to dice along line 17 through the V-groove 16 without damaging the adjacent end channels 13*e*** while maintaining uniform spacing between the channels across the entire width of a butted array printhead formed from these die assemblies. For further details on the use of V-grooves to stop chipping (albeit in sensor arrays) see U.S. Pat. Nos. 5,128,282 and 4,814,296, the disclosures of which are incorporated herein by reference in their entireties.

Figure 4:
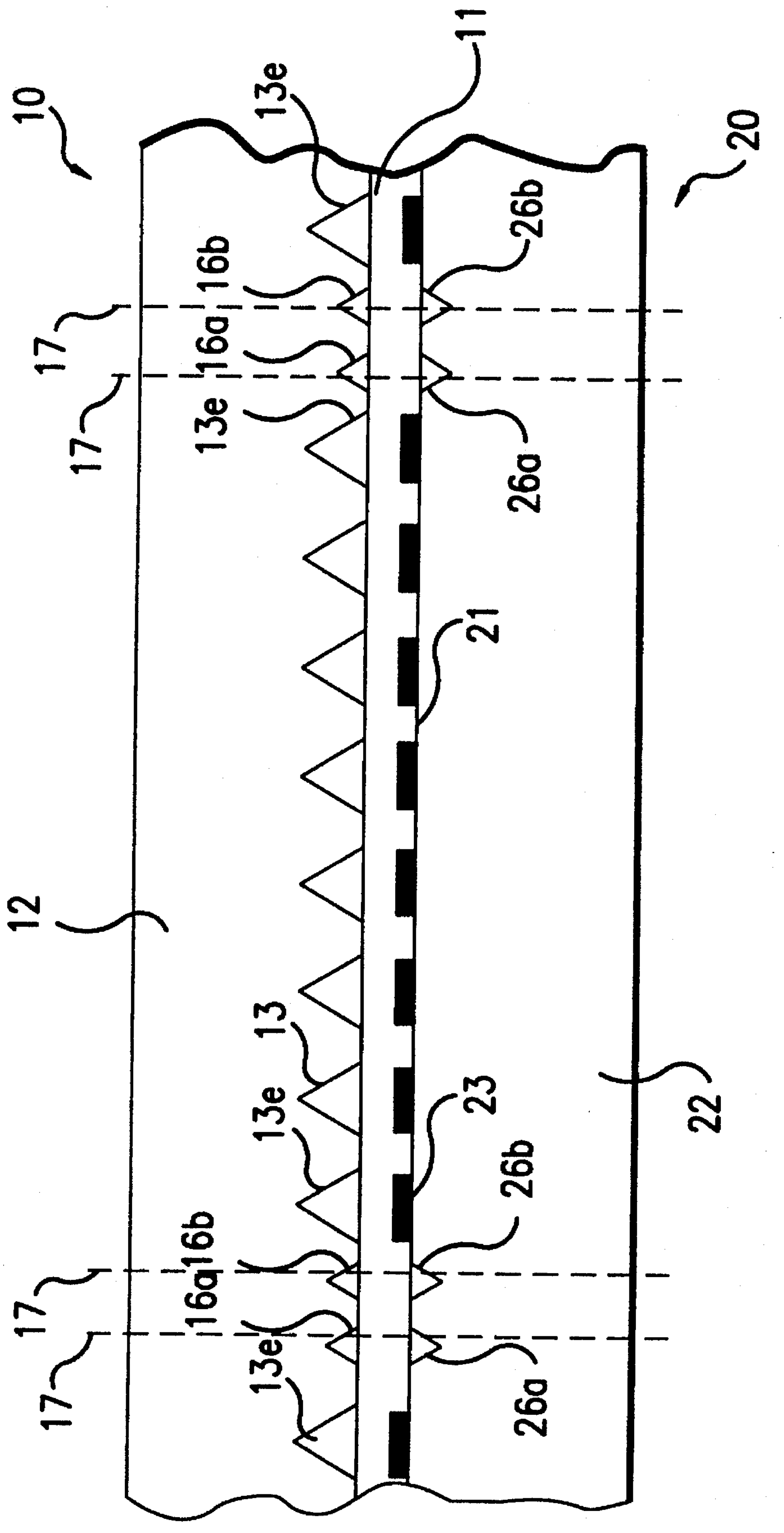
FIG. 4 is an enlarged front view similar to FIG. 2 of a second embodiment in which a pair of V-grooves are located between each individual heater plate and between each individual channel plate.

According to another embodiment of the present invention shown in FIG. 4, wafer 20 containing the individual heater plates 22 may be provided with pairs of V-grooves **26*a* and 26*b*. These V-grooves 26*a* and 26*b* are formed in a similar manner to the V-grooves 16*a* and 16*b* on wafer 10. The V-grooves 26*a* and 26*b* are positioned to correspond in alignment with the V-grooves 16*a* and 16*b* on the channel plate wafer 10. In this manner, chipping of the silicon on the heater plate 22 can also be controlled thereby reducing the possibility of damage to the heater elements 23**.

According to the method of a preferred embodiment of the present invention, the channels 13 and internal recesses 14 are formed on the wafer 10. At this time, the V-grooves **16*a* and 16*b* on the wafer 10 are also formed. The V-grooves 16*a* and 16*b*, channels 13 and internal recesses 14 can be formed, for example, by etching (e.g., anisotropic etching). The heater elements 23 and electrical connections (not shown) are formed on the top surface of wafer 20 by conventional techniques. V-grooves 26*a* and 26*b* may also be formed on wafer 20**.

The wafers 10 and 20 are then bonded together such that the heater elements 23 on an individual heater plate 22 are in alignment with the channels 13 in a corresponding channel plate 12. With this arrangement, the V-grooves **16*a* and 16*b* on the wafer 10 are positioned between the individual printhead die assemblies 2. If V-grooves 26*a* and 26*b* are provided on wafer 20, then the V-grooves 16*a* and 16*b* on wafer 10 are in alignment with the V-grooves 26*a* and 26*b* on wafer 20**.

The bonded wafers are then separated into individual printhead die assemblies 2 by dicing. Dicing can be performed by, for example, a high speed diamond blade to cut through the wafers 10, 20. During the dicing process, the individual printhead die assemblies 2 are separated by dicing through V-grooves **16*a* and 16*b*. Either a single dicing cut could cut through both V-grooves 16, 16*b* to simultaneously define buttable, end surfaces of the adjacent die assemblies from the bonded wafer pair, or, more preferably, a separate cut is made for each groove 16*a*, 16*b*. In this manner, chipping of the wafer 10 adjacent to the dice cut. which may cause damage to the end channels 13*e*, is reduced. As a result, uniformity of the individual channels 13 is improved to produce uniform printing. The separated printhead die assemblies 2 are then mounted to the substrate 3** using conventional techniques to form a pagewidth array.

While this invention has been described in conjunction with specific embodiments thereof, it is evident that many alternatives, modifications and variations will be apparent to those skilled in the art. Accordingly, the preferred embodiments of the invention as set forth herein are intended to be illustrative, not limiting. Various changes may be made without departing from the spirit and scope of the invention as defined in the following claims.

What is claimed is:

1. A method of fabricating individual buttable die assemblies for use in a pagewidth array ink jet printing apparatus comprising the steps of:

forming a plurality of ink actuator plates on a first substrate, each ink actuator plate having a plurality of actuator elements disposed on a first surface of said first substrate;

forming a plurality of channel plates on a second substrate, each channel plate having an array of channels formed in a first surface of said second substrate, each array of channels having a first end channel positioned at one end of said array and a second end channel positioned at an opposite end of said array, said array of channels of each channel plate being alignable with said plurality of actuator elements on a corresponding one of said ink actuator plates;

forming pairs of grooves on said first surface of said second substrate, said pairs of grooves being parallel to said channels, one of said pairs of grooves being located between the first end channel of one channel plate and an adjacent second end channel of an adjacent channel plate;

bonding said first surface of said first substrate to said first surface of said second substrate such that each of said plurality of channels on a channel plate are aligned with a corresponding one of said plurality of actuator elements on one of said plurality of ink actuator plates; and dicing said wafers along and through said grooves to form individual die assemblies.

2. The method according to claim 1, wherein said grooves are V-shaped.

3. The method according to claim 1, wherein said second substrate is a silicon wafer, and the step of forming said pairs of grooves includes etching said grooves into said first surface of said silicon wafer.

4. The method according to claim 3; wherein said pairs of grooves and said channels are formed in a single etching process.

5. The method according to claim 1, wherein peaks of said grooves are spaced from peaks of said end channels by a distance approximately equal to half a distance between peaks of adjacent channels.

6. The method according to claim 1, further comprising the step of:

forming ink actuator plate grooves on said first surface of said first substrate, said ink actuator plate grooves being located between adjacent ink actuator plates.

7. The method according to claim 6, wherein said ink actuator plate grooves are V-shaped.

8. The method according to claim 6, wherein said step of bonding said first and second substrates further includes aligning said pairs of grooves on said second substrate and said ink actuator plate grooves.

9. The method according to claim 8, wherein said step of dicing further includes dicing said first and second substrates along said aligned grooves to form said individual die assemblies.

10. A method of fabricating an ink jet pagewidth array printhead comprising the steps of:

forming a plurality of individual printhead die assemblies by:

forming a plurality of heater plates on a first substrate, each heater plate having a plurality of heating elements disposed on a first surface of said first substrate;

forming a plurality of channel plates on a second substrate, each channel plate having an array of channels formed in a first surface of said second substrate, each array of channels having a first end channel positioned at one end of said array and a second end channel positioned at an opposite end of said array, said array of channels of each channel plate being alignable with said plurality of heating elements on a corresponding one of said heater plates;

forming pairs of grooves on said first surface of said second substrate, said pairs of grooves being parallel to said channels, one pair of said pairs of grooves being spaced between the first end channel of one channel plate and an adjacent second end channel of an adjacent channel plate;

bonding said first surface of said first substrate to said first surface of said second substrate such that each of said plurality of channels on a channel plate are aligned with a corresponding one of said plurality of heating elements on one of said plurality of heater plates; and dicing said first and second substrates along and through said grooves to form a plurality of individual printhead die assemblies, said dicing defining a flat end surface on ends of each printhead die assembly that is substantially perpendicular to said first surfaces of said first and second substrates; and butting a plurality of said printhead die assemblies with each other by contacting said flat surface of adjacent printhead die assemblies to form said pagewidth array printhead.

11. The method according to claim 10, wherein said grooves are V-shaped.

12. The method according to claim 10, wherein said second substrate is a silicon wafer and the step of forming said pairs of grooves includes etching said grooves into said first surface of said silicon wafer.

13. The method according to claim 12, wherein said grooves and said channels are formed in a single process.

14. The method according to claim 10, wherein peaks of said grooves are spaced from peaks of said end channels by a distance approximately equal to half a distance between peaks of adjacent channels.

15. The method according to claim 10, wherein the step of forming individual printhead die assemblies further comprises the step of:

forming heater plate grooves on said first surface of said first substrate, said heater plate grooves being located between adjacent heater plates.

16. The method according to claim 15, wherein said heater plate grooves are V-shaped.

17. The method according to claim 15, wherein said step of bonding said first and second substrates further includes aligning said grooves in said second substrate and said heater plate grooves.

18. The method according to claim 17, wherein said step of dicing further includes dicing said first and second substrates along said aligned grooves to form said individual printhead die assemblies.

19. A method of fabricating individual buttable die assemblies for use in a pagewidth array ink jet printing apparatus comprising the steps of:

forming a plurality of ink actuator plates on a first substrate, each ink actuator plate having a plurality of actuator elements disposed on a first surface of said first substrate;

forming a plurality of channel plates on a second substrate, each channel plate having an array of channels formed in a first surface of said second substrate, each array of channels having a first end channel positioned at one end of said array and a second end channel positioned at an opposite end of said array, each array having an inter-channel spacing between channels, said array of channels of each channel plate being alignable with said plurality of actuator elements on a corresponding one of said ink actuator plates;

forming a plurality of grooves on said first surface of said second substrate, said plurality of grooves being parallel to said channels, each of said grooves being located adjacent to one of said end channels such that a groove is located adjacent to each end channel of each channel plate, a distance between each groove and its adjacent end channel being less than said inter-channel spacing;

bonding said first surface of said first substrate to said first surface of said second substrate such that each of said plurality of channels on a channel plate are aligned with a corresponding one of said plurality of actuator elements on one of said plurality of ink actuator plates; and dicing said wafers along and through said grooves to form individual die assemblies such that a distance from the end channel to the end of each die assembly as defined by the dice cut is approximately equal to one-half the inter-channel spacing.

20. The method according to claim 19, Wherein said grooves are V-shaped.

21. The method according to claim 19, wherein said second substrate is a silicon wafer, and the step of forming said pairs of grooves includes etching said grooves into said first surface of said silicon wafer.

22. The method according to claim 21, wherein said pairs of grooves and said channels are formed in a single etching process.

23. A printhead array comprising:

a substrate; and a plurality of individual printhead die assemblies butted against each other end-to-end, each of said individual printhead die assemblies including a heater plate and a channel plate, said heater plate having a plurality of individual heater elements disposed on a first surface, the first heater plate surface including dicing grooves positioned on opposite ends of the first heater plate surface and extending partially into said heater plate, each of said opposite ends having an end surface that intersects its corresponding dicing groove, said channel plate having a plurality of individual channel openings formed on a first surface, each channel opening corresponds to an individual heater element on said heater plate, said first channel plate surface including dicing grooves positioned on opposite ends of the first channel plate surface and extending partially into said channel plate, each of said channel plate opposite ends having an end surface that intersects its corresponding dicing groove, each of said channel openings including a peak, a distance D separating adjacent peaks of adjacent channel openings, said dicing grooves on said channel plate being positioned relative to end channel openings on the channel plate such that the peak of the end channel on one channel plate is spaced the distance D from a peak of the end channel on an adjacent channel plate.

24. The printhead array according to claim 23, wherein the distance D is between 10 μm and 150 μm.

* * * * *